(12) United States Patent
Yamaguchi et al.

(10) Patent No.: US 7,714,425 B2
(45) Date of Patent: May 11, 2010

(54) SEMICONDUCTOR DEVICE, METHOD FOR MANUFACTURING THE SAME, AND FLEXIBLE SUBSTRATE FOR MOUNTING SEMICONDUCTOR

(75) Inventors: Masahiro Yamaguchi, Tokyo (JP); Hisashi Tanie, Tokyo (JP); Naoto Saito, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/233,663

(22) Filed: Sep. 19, 2008

(65) Prior Publication Data
US 2009/0134506 A1    May 28, 2009

(30) Foreign Application Priority Data
Oct. 4, 2007 (JP) .............................. 2007-261081

(51) Int. Cl.
*H01L 23/02* (2006.01)
(52) U.S. Cl. .................. 257/686; 257/777; 438/107
(58) Field of Classification Search ................ 257/686, 257/777, 778, 723, 724; 438/107, 113, 108
See application file for complete search history.

(56) References Cited

U.S. PATENT DOCUMENTS

| | | | |
|---|---|---|---|
| 6,141,245 A | 10/2000 | Bertin et al. | |
| 6,528,870 B2 * | 3/2003 | Fukatsu et al. | 257/685 |
| 7,417,308 B2 * | 8/2008 | Park | 257/686 |
| 7,466,577 B2 * | 12/2008 | Sekiguchi et al. | 365/51 |
| 2007/0170573 A1 * | 7/2007 | Kuroda et al. | 257/686 |
| 2008/0174000 A1 * | 7/2008 | Chen et al. | 257/686 |
| 2009/0166835 A1 * | 7/2009 | Yang et al. | 257/686 |

FOREIGN PATENT DOCUMENTS

| | | |
|---|---|---|
| JP | 59-222954 | 12/1984 |
| JP | 08-236694 | 9/1996 |
| JP | 2000-286380 | 10/2000 |
| JP | 2002-176135 | 6/2002 |
| JP | 2004-281633 | * 10/2004 |
| JP | 2006-278863 | 10/2006 |

\* cited by examiner

*Primary Examiner*—S. V Clark
(74) *Attorney, Agent, or Firm*—Young & Thompson

(57) ABSTRACT

A semiconductor device includes a second semiconductor package, which includes a substrate and at least one semiconductor package. The substrate includes a terminal group formed on a surface thereof. At least one first semiconductor package is stacked on the substrate, and includes a plurality of flexible substrates, each of which includes a wiring group on a surface thereof and each of which is bending-deformable. At least one first semiconductor package includes a plurality of semiconductor elements mounted on a plurality of flexible substrates. Electric conduction through the second semiconductor package is established by connecting the wiring group on each of a plurality of flexible substrates to the terminal group on the substrate. Further, at least one terminal of the terminal group on the substrate is electrically connected to all of the plurality of semiconductor elements on at least one first semiconductor package, and at least one other terminal of the terminal group is electrically connected only to particular semiconductor elements of the plurality of semiconductor elements.

22 Claims, 12 Drawing Sheets

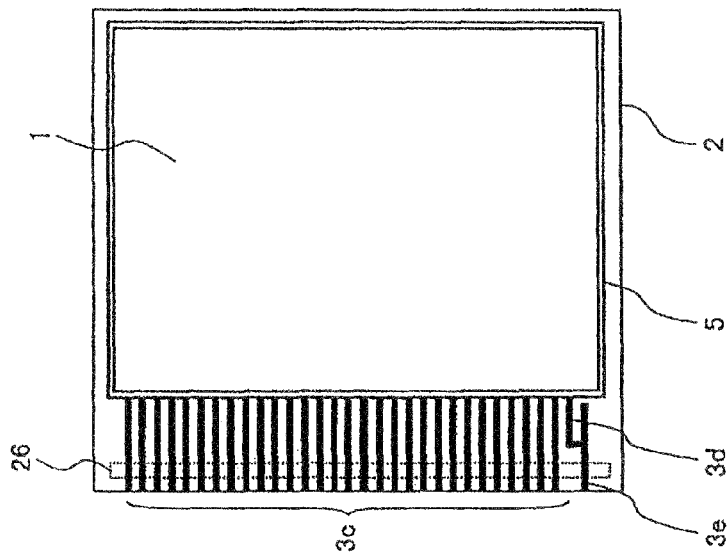
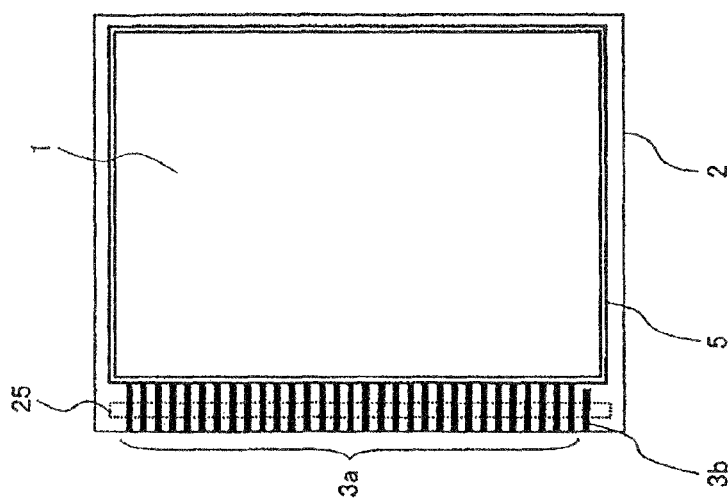
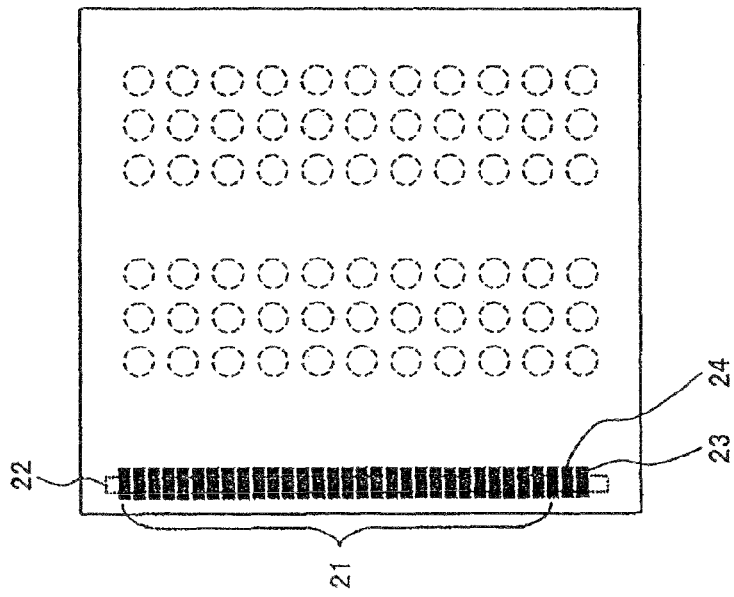

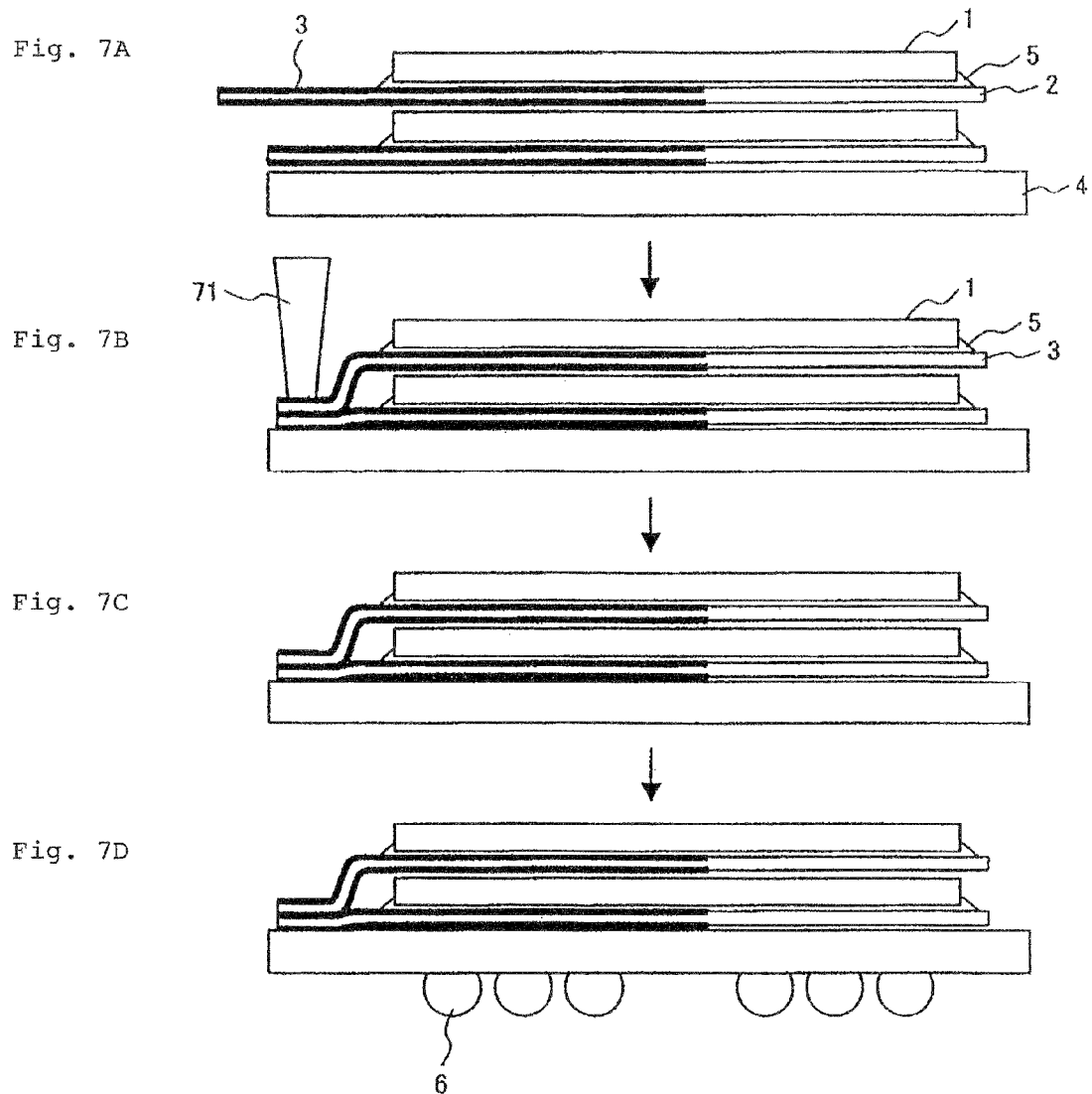

SEMICONDUCTOR DEVICE, METHOD FOR MANUFACTURING THE SAME, AND FLEXIBLE SUBSTRATE FOR MOUNTING SEMICONDUCTOR

BACKGROUND OF THE INVENTION

1. Field of the Invention

The present invention relates to a mounting technique for a semiconductor device, and particularly relates to a semiconductor device, a method for manufacturing the same, and a flexible substrate for mounting a semiconductor.

2. Description of Related Art

For information devices such as large-sized computers, personal computers, and portable devices, the performance of these devices has been improved and the sizes of these devices have been reduced year by year. Thus, while the size of semiconductor elements mounted in these devices has been increased, the area of a mounting substrate on which the semiconductor elements are mounted has been decreased. Consequently, markets strongly demand that a large number of semiconductor elements be mounted in a limited substrate area. Thus, techniques for mounting and stacking a plurality of semiconductor elements have been developed as methods for meeting the above-described demand.

One of the techniques for mounting and stacking semiconductor elements uses one semiconductor element, a wiring member, and the like to form a first semiconductor package, and then a plurality of the first semiconductor packages are stacked so as to manufacture a second semiconductor package in which a plurality of semiconductor devices are stacked. Stacking techniques based on this form are disclosed in JP-A-2002-176135, JP-A-H8-236694, and JP-A-2000-286380.

In connection with the above-described techniques, JP-A-2006-278863 discloses a technique of using one semiconductor element, a bending-deformable flexible substrate, and the like to form a first semiconductor package, and then flexible substrates of a plurality of semiconductor packages are bent and joined to one substrate so as to manufacture a second semiconductor package. In addition to the above-described methods, as a technique of stacking semiconductor elements, a technique of stacking a plurality of semiconductor elements to manufacture one semiconductor package has been developed. Techniques based on this form are disclosed in U.S. Pat. No. 6,141,245 and JP-A-S59-222954.

SUMMARY

A high-density mounted semiconductor device is obtained by using a semiconductor element, a bending-deformable flexible substrate, and the like to form a first semiconductor package. Further, the high-density mounted semiconductor device is obtained by joining flexible substrates included in a plurality of the first semiconductor packages to one substrate so as to form a second semiconductor package in which a plurality of semiconductor devices are stacked. In this semiconductor device, the flexible substrates of the respective first semiconductor packages are joined to different positions on the substrate, the size of the substrate needs to be increased consistently with the number of stacks. This lowers the density of mounted semiconductor elements.

On the other hand, if the flexible substrates are joined to the same position on the substrate, a plurality of flexible substrates with different wiring patterns need to be prepared in order to allow the respective semiconductor elements to operate individually. This increases manufacturing costs. The use of flexible substrates with the same wiring pattern prevents a plurality of semiconductor elements that are mounted in the second semiconductor package from communicating separately with external devices.

The present invention seeks to solve one or more of the above problems, or to improve upon those problems at least in part.

The first aspect of the present invention provides a semiconductor device comprising: a second semiconductor package comprising: (a) a substrate including a terminal group formed on a surface thereof; and (b) at least one first semiconductor package stacked on the substrate and comprising: a plurality of flexible substrates, each of which includes a wiring group on a surface thereof and each of which is bending-deformable; and a plurality of semiconductor elements mounted on the plurality of flexible substrates, wherein electric conduction through the second semiconductor package is established by connecting the wiring group on each of the plurality of flexible substrates to the terminal group on the substrate, and wherein for the plurality of flexible substrates, the size of the flexible substrate increases consistently with a height at which the flexible substrate is located, and a joining portion of the wiring group on each of the plurality of flexible substrates is located on the terminal group.

The second aspect of the present invention provides a method for manufacturing a semiconductor device, comprising: preparing a plurality of flexible substrates on which semiconductor elements are mounted, each of which includes a flexible substrate on which a semiconductor element is mounted, the flexible substrate including, on a surface thereof, an inspection terminal group and a wiring group continuous with the inspection terminal group, the flexible substrate being bending-deformable; stacking the flexible substrates on a substrate with the terminal group, the semiconductor elements being mounted on the flexible substrates; using the inspection terminal group to inspect the semiconductor element for operation; manufacturing at least one first semiconductor package by cutting the flexible substrates on which the semiconductor elements are mounted so that the flexible substrates that are positioned higher is longer in a length direction of the wiring group than the flexible substrates that are positioned lower; and manufacturing a second semiconductor package by joining and overlapping the wiring groups on the terminal group on the substrate, the wiring groups being disposed on the flexible substrates on which the semiconductor elements are mounted.

The third aspect of the present invention provides a flexible substrate which includes a wiring pattern on each of opposite surfaces and which is bending-deformable, the flexible substrate comprising: a wiring group with a linear portion connected to a semiconductor element mounted on the wiring pattern; and a wiring pattern which is continuous with the wiring group, and which includes an inspection terminal group of the semiconductor element and a portion that is not connected to the semiconductor element.

By preparing flexible substrates with one type of wiring pattern and varying a cut position among the flexible substrates, first semiconductor packages with wiring patterns corresponding to stacking positions can be manufactured. This eliminates the need to prepare a plurality of flexible substrates with different wiring patterns, and enables an increase in the mounting density of the semiconductor device and a reduction in manufacturing costs.

BRIEF DESCRIPTION OF THE DRAWINGS

The above features and advantages of the present invention will be more apparent from the following description of certain preferred embodiments taken in conjoining with the accompanying drawings, in which:

FIG. 2A is a diagram illustrating a substrate of the semiconductor device according to the first exemplary embodiment of the present invention;

FIG. 2B is a diagram illustrating a lower stage package of the semiconductor device according to the first exemplary embodiment of the present invention;

FIG. 2C is a diagram illustrating an upper stage package of the semiconductor device according to the first exemplary embodiment of the present invention;

FIGS. 7A to 7D are flow diagrams illustrating the method for manufacturing the semiconductor device according to the first exemplary embodiment of the present invention;

DETAILED DESCRIPTION OF EXEMPLARY EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Exemplary Embodiment

Figure 1A:
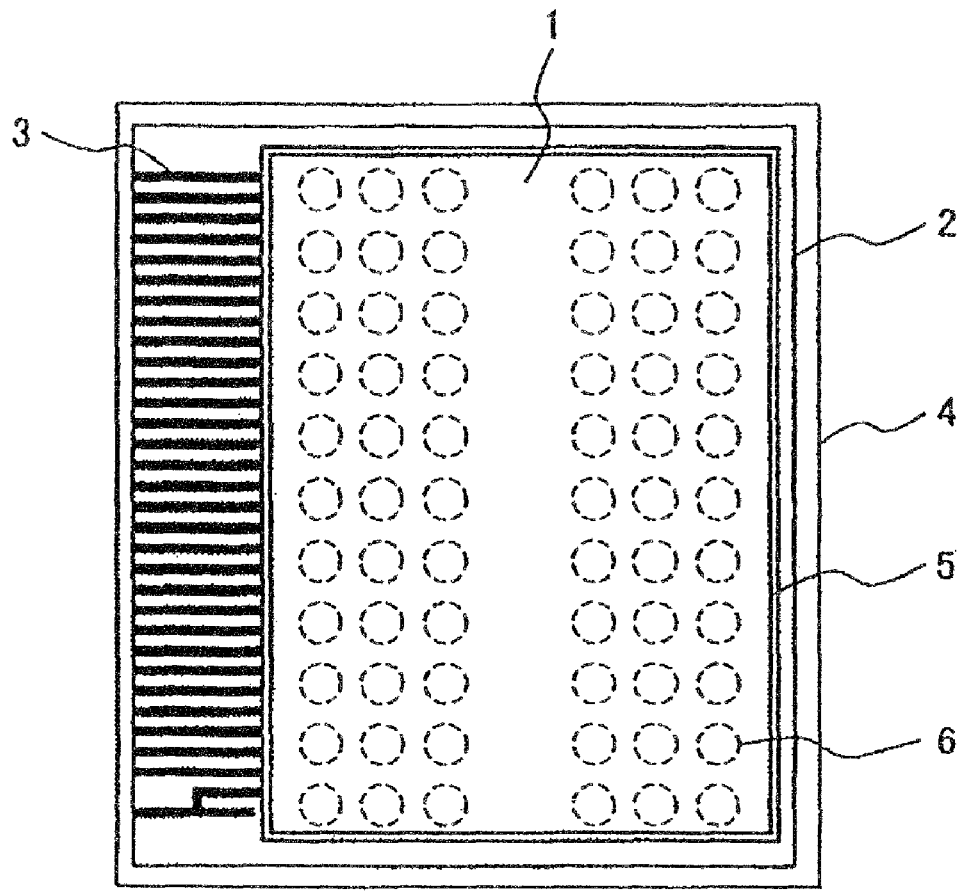
FIG. 1A is a top view of a semiconductor device according to a first exemplary embodiment of the present invention.
Figure 1B:
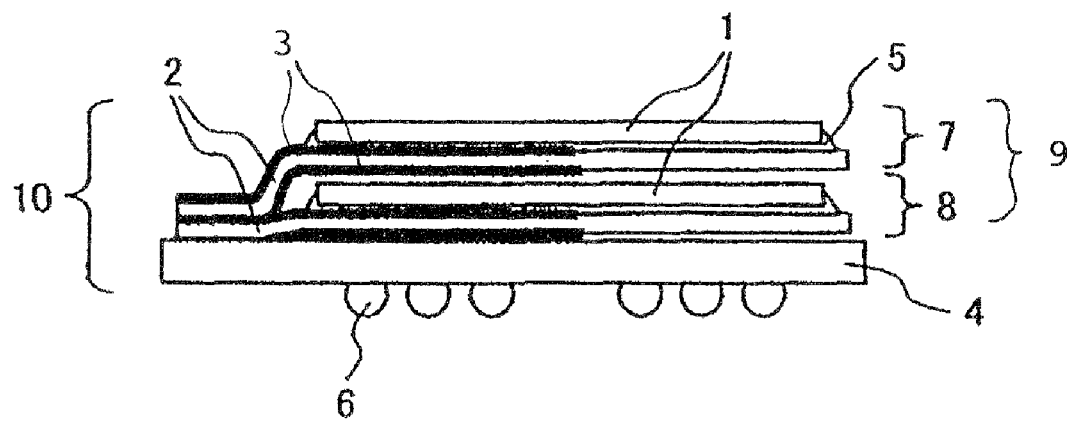
FIG. 1B is a side view of the semiconductor device according to the first exemplary embodiment of the present invention.

A first exemplary embodiment will be described below with reference to the drawings. FIG. 1 is a top view and a side view of a semiconductor device according to the first exemplary embodiment of the present invention.

In the present exemplary embodiment, two first semiconductor packages 9 are stacked on substrate 4 to form second semiconductor package 10. Each of first semiconductor packages 9 includes flexible substrate 2 with wires 3 provided on each of the opposite surfaces thereof, and semiconductor element 1.

Semiconductor element 1 is mounted on flexible substrate 2. Bumps 41 (illustrated in FIG. 4B) provided on a surface of semiconductor element 1 are joined to wires 3 to establish electric conduction between semiconductor element 1 and wires 3 on flexible substrate 2. Sealing resin 5 is provided between semiconductor element 1 and flexible substrate 2, whereby the joining between bumps 41 on semiconductor element 1 and wires 3 is protected.

In the present exemplary embodiment, silicon having a thickness of about 0.2 mm is used for semiconductor element 1. A polyimide resin having a thickness of about 0.03 mm is used for flexible substrate 2. Copper having a thickness of about 0.01 mm is used for wires 3 provided on a surface of flexible substrate 2.

For surface protection, the surface of each of wires 3 is plated with nickel or the like. Furthermore, a thin resin coat is formed on an area of the surface of wire 3 which needs to be insulated. Electric conduction through wire 3 that is provided on each of the opposite surfaces of flexible substrate 2 is established via a plurality of vias provided in a polyimide portion. A glass epoxy substrate with 2-layer wire 3 is used as substrate 4.

In stacked first semiconductor packages 9, the electric conduction between lower stage package 8 that is located below and substrate 4 is established by joining terminals arranged on substrate 4 in a line to some of wires 3. Wires 3 on lower stage package 8 are connected to corresponding wires 3 on upper stage package 7 above the joining between substrate 4 and lower stage package 8 to establish the electric conduction between upper stage package 7 and substrate 4 via lower stage package 8. In this case, flexible substrate 2 of upper stage package 7 is bending-deformed so as to absorb the thickness of lower stage package 8 and the difference between upper stage package 7 and lower stage package 8 in the height of a position to which each of the packages is joined.

In the present exemplary embodiment, the joining between lower stage package 8 and substrate 4 and the joining between upper stage package 7 and lower stage package 8 are achieved using ultrasonic bonding.

Substrate 4 includes solder balls 6 on a surface thereof which is opposite to the surface thereof on which first semiconductor package 9 is mounted, to form second semiconductor package 10. Using solder balls 6 to mount the package on substrate 4 enables communication with external devices. The present invention is characterized in that the terminals arranged on substrate 4 in a line include those which are electrically connected to all semiconductor elements 1 mounted in second semiconductor package 10 and those which are each electrically connected to any particular one of semiconductor elements 1. A structure allowing this characteristic to be realized will be described in detail with reference to FIGS. 2A to 2C.

FIG. 2A shows a plan view of the top surfaces of substrate 4 lower stage package 8, and upper stage package 7 which have not yet been joined. A group of a plurality of terminals 21, 23, and 24 is arranged on the surface of substrate 4 in a line. In the present exemplary embodiment, the terminal located at the lowermost position in FIG. 2A is terminal 23, electrically connected only to upper stage package 7. The terminal located on terminal 23 is terminal 24, electrically connected only to lower stage package 8. The other terminals are electrically connected to both upper and lower stage packages 7 and 8.

The terminals are joined to lower stage package 8 at a joining position at one time by means of ultrasonic bonding. At this time, terminal 23, electrically connected only to upper stage package 7, is located adjacent to terminal 24, electrically connected only to lower stage package 8.

In lower stage package 8, wires 3 are led out in a direction orthogonal to a joining position which is provided on flexible substrate 2 and where substrate 4 and upper stage package 7 are joined together. Wires 3 extend to an end portion of flexible substrate 2. Among wires 3, wires 3a joined to terminals 21 and 24 on substrate 4 are electrically connected to semiconductor element 1 mounted in lower stage package 8. However, wire 3b joined to terminal 23 on substrate 4 includes a terminal portion before reaching semiconductor element 1 and is not electrically connected to semiconductor element 1.

In upper stage package 7, as shown in FIG. 2C, wires 3 are led out in a direction orthogonal to joining position 26 which is provided on flexible substrate 2 and where upper stage package 7 and lower stage package 8 are joined together. As in the case of lower stage package 8, wires 3 extend to the end portion of flexible substrate 2. Flexible substrate 2 of upper stage package 7 is larger than that of lower stage package 8. This is because when first semiconductor packages 9 are stacked, the distance from upper stage package 7 to substrate 4 is longer than that from lower stage package 8 to substrate 4, so that flexible substrate 2 of upper stage package 7 needs to be larger than that of lower stage package 8 in order to allow substrate 4 and upper stage package 7 to be joined together.

Wires 3 on upper stage package 7 are longer than wires 3 on lower stage package 8 by an amount corresponding to the difference in the size of flexible substrate 2. When second semiconductor package 10 is formed, wires 3 on upper stage package 7 are not directly joined to substrate 4 but are electrically connected to substrate 4 via wires 3 on lower stage package 8. Each wire 3c on upper stage package 7 located at the same position as that of the corresponding terminal on substrate 4 in the vertical direction of FIG. 2C is located so as to extend linearly to the end portion of flexible substrate 2. On the other hand, wire 3d on upper stage package 7 located at the same position as that of the corresponding terminal on substrate 4 in the vertical direction of FIG. 2C is bent downward in FIG. 2C on flexible substrate 2 at a position closer to semiconductor element 1 than to joining position 26 where upper stage package 7 and lower stage package 8 are joined together. Wire 3d is connected to wire 3e located at the same position as that of terminal 23 in the vertical direction of FIG. 2C.

Wire 3e diverges in two directions at a position where wire 3e is connected to bent wire 3d. One of the wires extends to the end portion of flexible substrate 2, whereas the other wire extends toward semiconductor element 1. However, wire 3e extending toward semiconductor element 1 includes a terminal portion before reaching semiconductor element 1 and is not electrically connected to semiconductor element 1 directly but via wire 3d. In this case, the distance from the position where wire 3d bends downward in FIG. 2C to the end portion of flexible substrate 2 is longer than the difference in length between flexible substrates 2 of upper and lower stage packages 7 and 8. The length over which wire 3d bends, that is, the distance between wires 3d and 3e, is equal to the distance between the terminals on substrate 4.

Two types of first semiconductor package 9 with the above-described wiring patterns are joined to substrate 4 and to another first semiconductor package 9 to form a semiconductor device that is second semiconductor package 10. At this time, wires 3a and 3c joined to the terminals are each electrically connected to semiconductor element 1 mounted on first semiconductor package 9. Terminal 24 is joined to wire 3a on lower stage package 8 and thus electrically connected to semiconductor element 1 of lower stage package 8. However, terminal 24 is not joined to wire 3d on upper stage package 7. Therefore, terminal 24 is not electrically connected to semiconductor element 1 of upper stage package 7.

Terminal 23 is joined to wire 3b not electrically connected to semiconductor element 1 of lower stage package 8. Consequently, terminal 23 is not electrically connected to semiconductor element 1 of lower stage package 8 but is joined to wire 3e on upper stage package 7. Thus, terminal 23 is electrically connected to semiconductor element 1 of upper stage package 7 via wire 3d. The semiconductor device according to the present invention can be formed by joining two types of first semiconductor packages 9 with different wiring patterns to substrate 4 as described above.

Now, a first method for manufacturing a semiconductor device according to the first exemplary embodiment of the present invention will be described with reference to FIGS. 3 to 7.

Figure 3A:
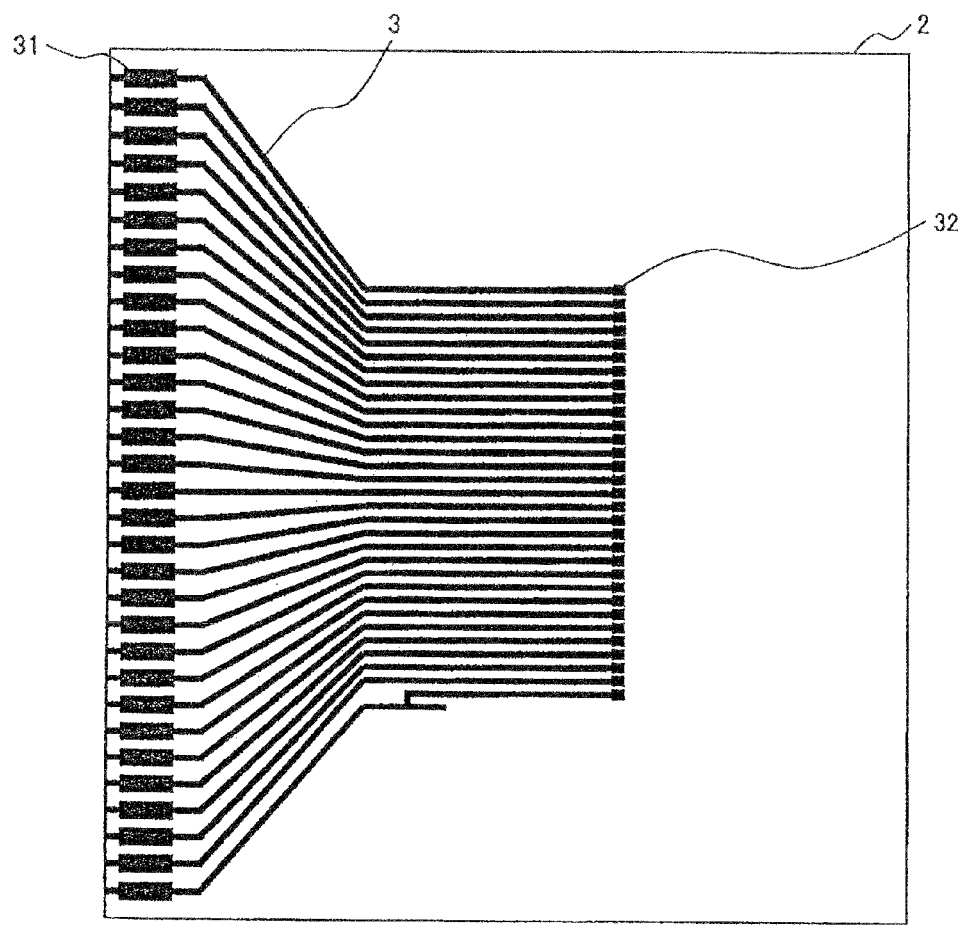
FIGS. 3A and 3B are a plan view and a side sectional view of a flexible substrate for mounting a semiconductor element, illustrating a first method for manufacturing a semiconductor device according to the first exemplary embodiment of the present invention.
Figure 3B:
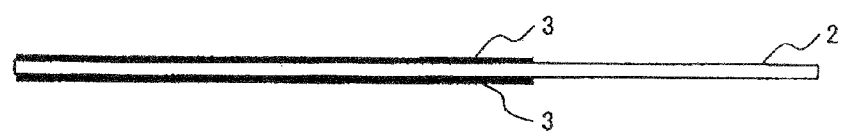

First, as illustrated in FIGS. 3A and 3B, a plurality of flexible substrates 2 each with wires 3 are provided on opposite surfaces thereof. In this case, the size of each of flexible substrates 2 is larger than those of flexible substrates 2 of lower stage package 8 and upper stage package 7. Wires 3 include group of terminals 32 for joining to a plurality of semiconductor elements 1, in a part of the area where semiconductor element 1 is mounted. Wires 3 further include inspection terminal group 31 having a larger pitch and a larger terminal size than those of group of joining terminals 32. In this case, some of wires 3 include a step-like wiring pattern in which the number of steps is equal to or greater than that of stacked first semiconductor packages 9. Further, some of wires 3 include a linear wiring pattern having a terminal portion located closer to the position where semiconductor element 1 is mounted, than the step-like wiring pattern. The length of this linear portion is determined depending on the number of stacked first semiconductor packages 9.

Figure 4A:
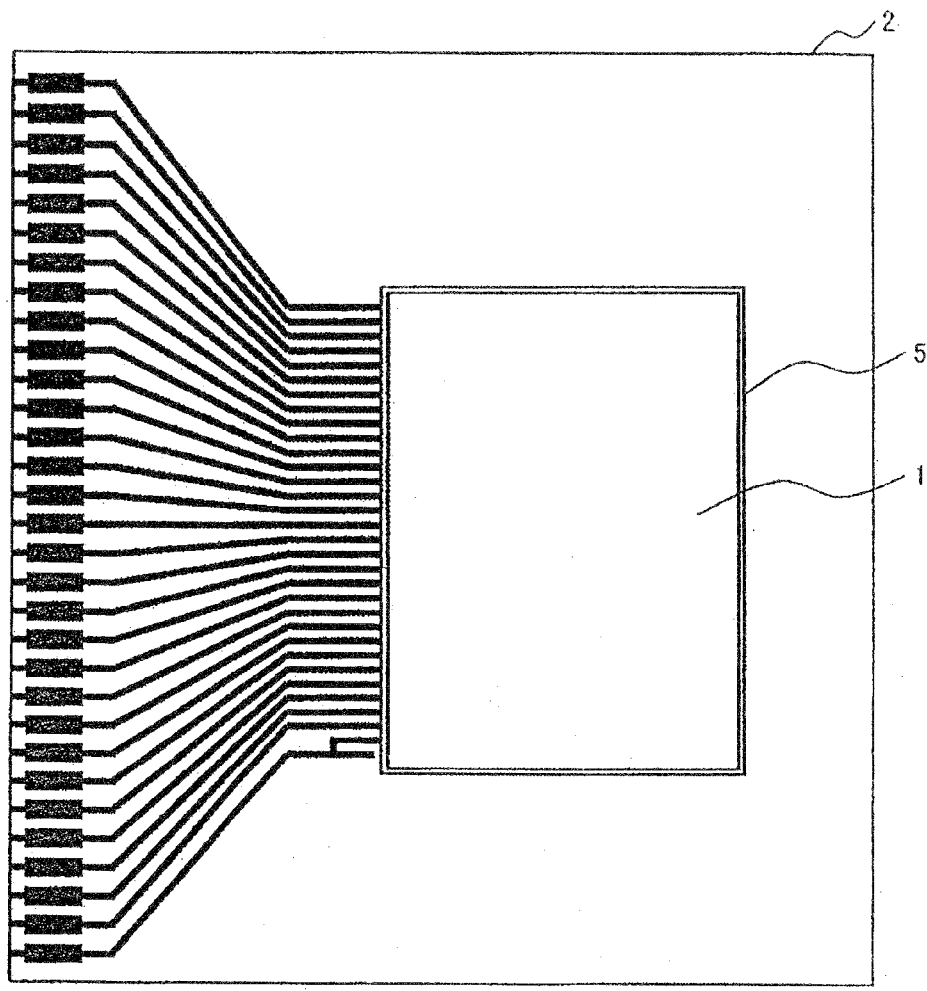
FIGS. 4A and 4B are a plan view and a side sectional view of another flexible substrate for mounting a semiconductor element, illustrating the method for manufacturing the semiconductor device according to the first exemplary embodiment of the present invention.
Figure 4B:
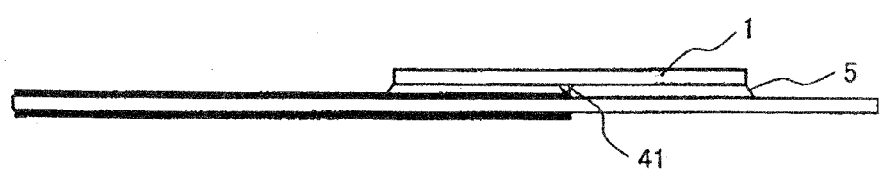

Then, as illustrated in FIGS. 4A and 4B, semiconductor element 1 is mounted on one side of each flexible substrate 2. At this time, semiconductor element 1 is placed so that bumps 41 provided on a surface of semiconductor element 1 are joined to respective terminals 32 for joining to semiconductor element 1 on flexible substrate 2. Moreover, after bumps 41 are joined to terminals 32 for joining to semiconductor element 1, the joining portions are sealed with sealing resin 5. In the present exemplary embodiment, gold is used as a material for bumps 41. An epoxy resin containing a ceramic filler is used as sealing resin 5. The flexible substrate thus obtained is hereinafter referred to as a flexible substrate on which a semiconductor is mounted, and the flexible substrate on which the semiconductor element has not been mounted is hereinafter referred to as a flexible substrate for mounting a semiconductor element, as required.

After each bump 41 is joined to corresponding terminal 32 for connection to semiconductor element 1, sealing resin 5 in an uncured, liquid condition may be poured into the gap between bump 41 and connection terminal 32 for connection to semiconductor element 1 and then cured. Alternatively, sealing resin 5 may be placed at a sealing position before joining and cured after the joining is made.

In the former case, no uncured sealing resin 5 is present in the joining portion during joining. Advantageously, the resin can be completely prevented from flowing into the joining portion so as to cause an improper joining. In the latter case, the resin need not be poured into a narrow space. This advantageously eliminates the need for the time required to pour the resin and enables the use of a viscous resin that is difficult to pour. For manufacturing purposes, a sealing method can be selected according to these characteristics.

Figure 5:
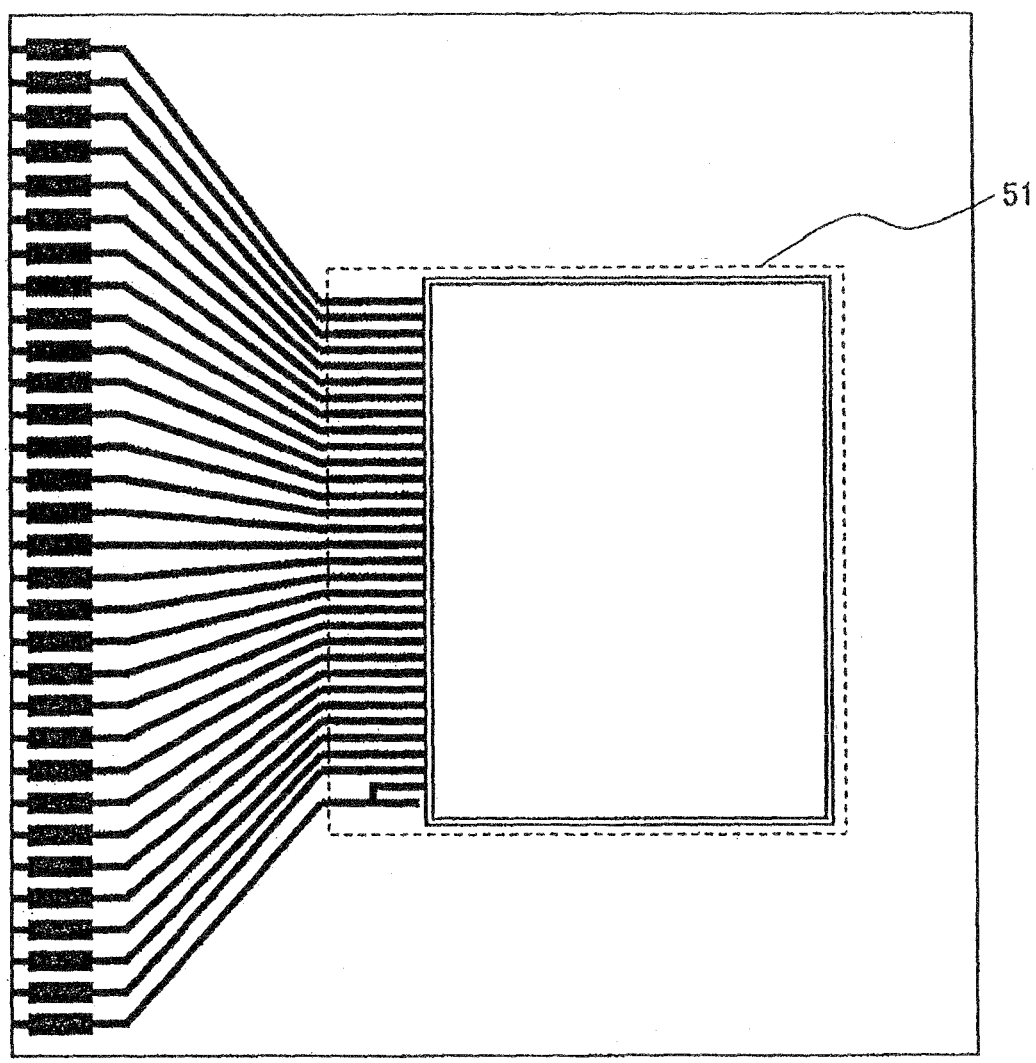
FIG. 5 is a plan view of a flexible substrate for mounting a semiconductor element, illustrating the method for manufacturing the semiconductor device according to the first exemplary embodiment of the present invention.

As illustrated in FIGS. 4A and 4B, semiconductor element 1 is joined to flexible substrate for mounting a semiconductor element 2. Then, the operation of semiconductor element 1 can be inspected using inspection terminal group 31 on flexible substrate 2. Flexible substrates 2 are then extracted which include semiconductor elements 1 mounted thereon and which have been determined to be acceptable as a result of the operation inspection. Half of flexible substrates 2 are cut at a cutting position for the upper stage package as illustrated in FIG. 5 to complete upper stage package 7.

Figure 6:
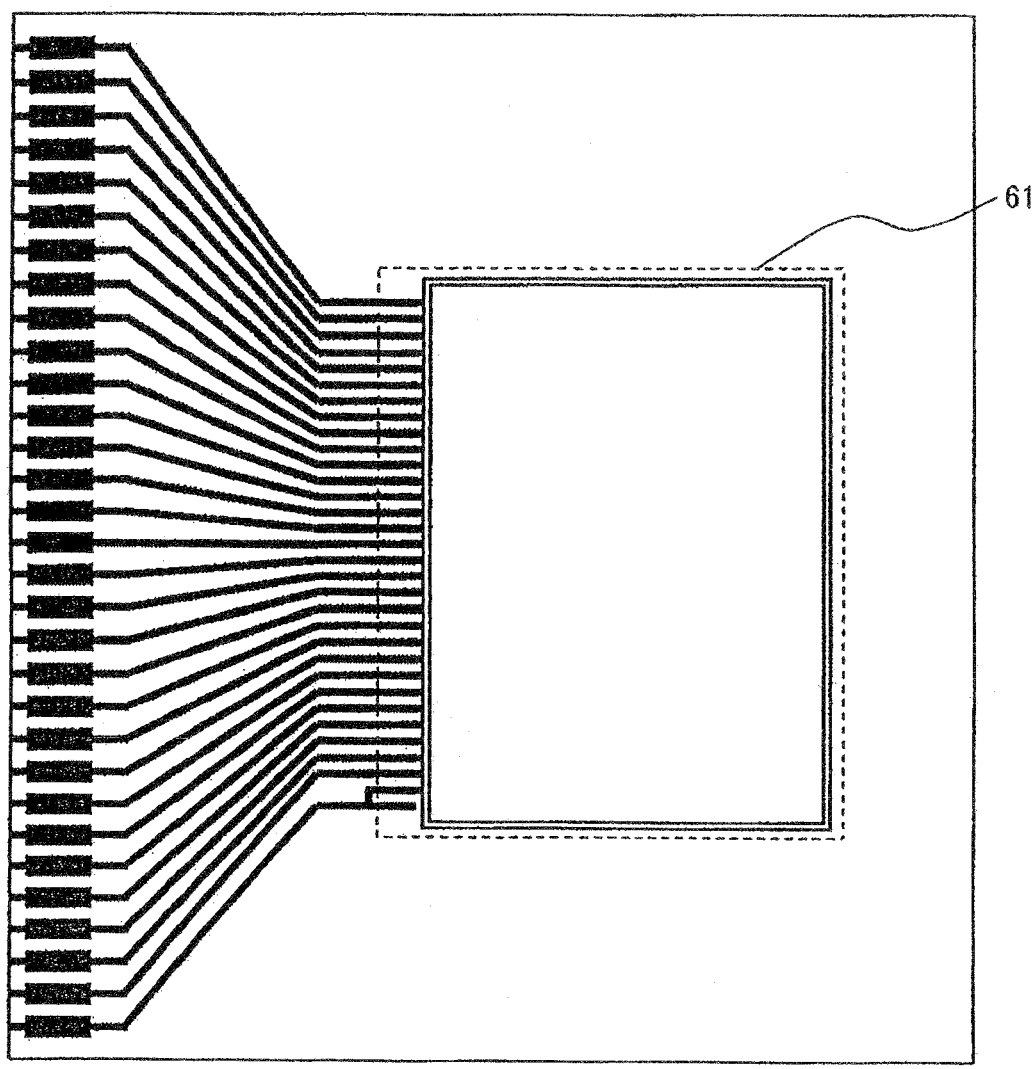
FIG. 6 is a plan view of a flexible substrate for mounting a semiconductor element, illustrating the method for manufacturing the semiconductor device according to the first exemplary embodiment of the present invention.
Figure 8A:
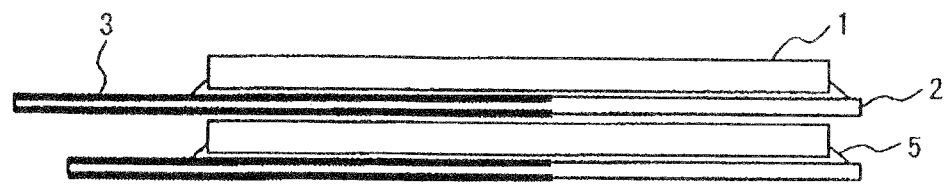
FIGS. 8A to 8D are flow diagrams illustrating a second method for manufacturing a semiconductor device according to a second exemplary embodiment of the present invention.
Figure 8B:
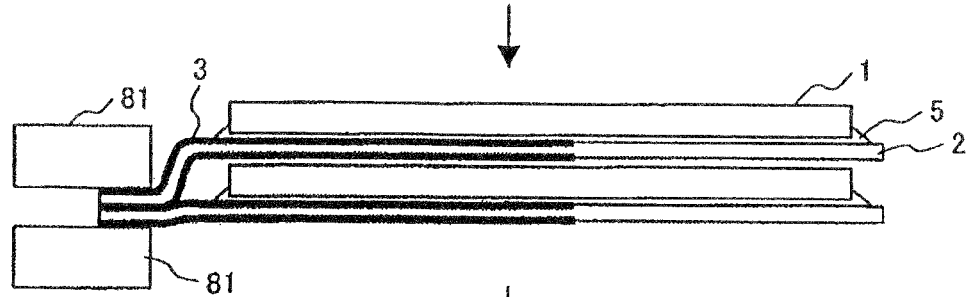
Figure 8C:
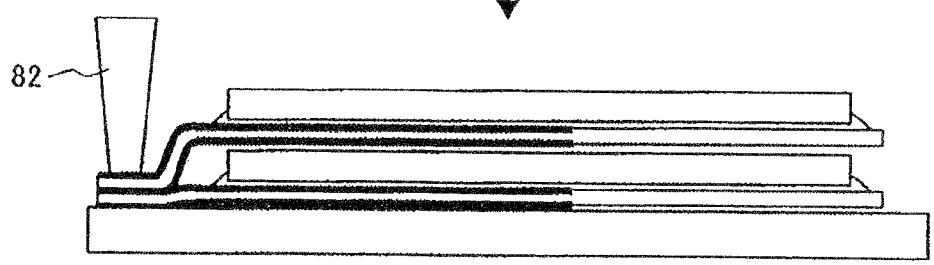
Figure 8D:
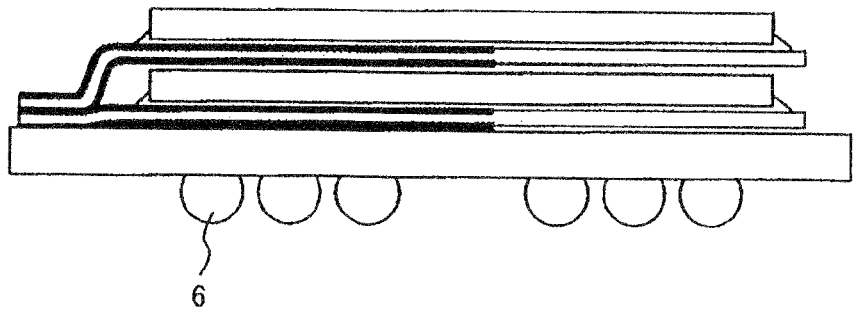

On the other hand, as shown in FIG. 6, the other half of flexible substrates 2 are cut at cuffing position 61 for the lower stage package to complete lower stage package 8. In this case, cutting position 51 for the upper stage package is different from cutting position 61 for the lower stage package. As a result, all of the flexible substrates of the first half of flexible substrates 2 have the same wiring pattern. Nevertheless, the external size of completed upper stage package 7 is different from that of lower stage package 8, and the wiring patterns of completed upper stage package 7 and lower stage package 8 may be different from each other as illustrated in FIG. 2.

Then, the semiconductor packages are stacked on substrate 4, and joined together using joining tool 71 as illustrated in FIGS. 7A to 7D. Moreover, solder balls 6 are provided on substrate 4 to complete the semiconductor device. FIG. 7A illustrates a stack of first semiconductor packages 9. FIG. 7B illustrates the overlapping of end portions of first semiconductor packages 9. FIG. 7C illustrates joining of the overlapping portions. FIG. 7D illustrates formation of solder balls 6 on substrate 4.

The present manufacturing method allows the semiconductor elements and the flexible substrates to be handled regardless of whether the semiconductor elements and the flexible substrates are for the upper or lower stage until the semiconductor elements are inspected for operation. Thus, even with a malfunctioning semiconductor element, normally operating semiconductor elements alone can be extracted through inspections and first semiconductor packages can be prepared for each of the upper and lower stages. Therefore, normally operating semiconductor elements can be efficiently used, enabling a general reduction in manufacturing costs.

With a semiconductor device other than the one according to the present invention, two types of flexible substrates having different wiring patterns need to be initially prepared. As a result, if for example, the same number of first semiconductor packages are manufactured for each of the upper and lower stages, when the number of normally operating ones of the semiconductor elements mounted on the flexible substrate for the lower stage is different from that of normally operating ones of the semiconductor elements mounted on the flexible substrate for the upper stage, the normally operating semiconductor elements on one of the flexible substrates cannot be used in spite of the normal operation thereof. Also in this regard, the application of the present invention enables an efficient, inexpensive semiconductor device to be manufactured.

Second Exemplary Embodiment

A second method for manufacturing a semiconductor device according to a second exemplary embodiment of the present invention will be described with reference to FIGS. 8A to 8D. According to the manufacturing method according to the first exemplary embodiment, flexible substrate 2 included in each of stacked first semiconductor packages 9 is joined directly to substrate 4. The manufacturing method according to the second exemplary embodiment is different from that according to the first exemplary embodiment in that (a) first, plural first semiconductor packages 9 are stacked, (b) flexible substrates 2 are joined together using flexible substrate joining tool 81, and (c) flexible substrates 2 are joined to substrate 4 using another flexible substrate-substrate joining tool 82. The remaining part of the manufacturing method according to the second exemplary embodiment is similar to that of the manufacturing method according to the first exemplary embodiment.

The manufacturing method according to the first exemplary embodiment advantageously allows all joinings to be completed at one time, enabling a reduction in manufacturing time. However, bending and joining of flexible substrates 2 need to be simultaneously performed. On the other hand, in the manufacturing method according to the second exemplary embodiment, after bending of flexible substrate 2 and joining of flexible substrates 2 are performed, flexible substrates 2 may be joined to substrate 4. Therefore, the manufacturing method according to the second exemplary embodiment can provide processing conditions that provide more tolerance than a case where all processing operations are performed at one time. The semiconductor device according to the present invention can be manufactured using any manufacturing methods according to these characteristics.

Third Exemplary Embodiment

Figure 9:
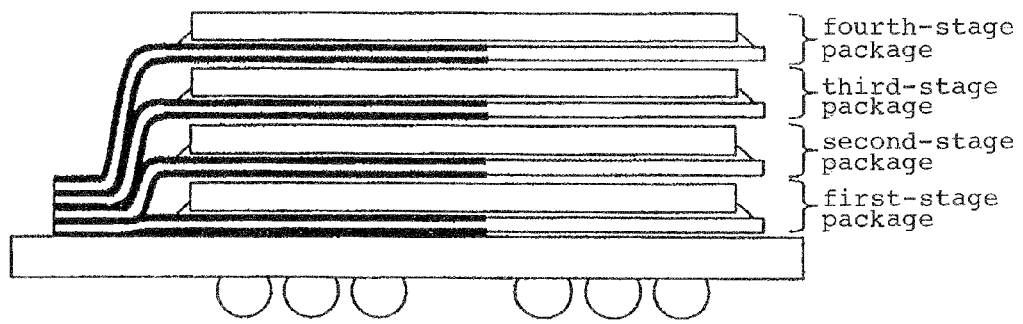
FIG. 9 is a side sectional view of a semiconductor device according to a third exemplary embodiment of the present invention.

FIG. 9 is a side sectional view of a semiconductor device according to a third exemplary embodiment of the present invention. The third exemplary embodiment is different from the first and second exemplary embodiments in that a semiconductor device is configured such that four first semiconductor packages 9 are mounted in second semiconductor package 10. In the first and second exemplary embodiments, two semiconductor elements 1 are mounted in second semiconductor package 10. However, in the present exemplary embodiment, four semiconductor elements 1 are mounted with the size of substrate 4 remaining unchanged. Thus, the application of the third exemplary embodiment of the present invention enables more semiconductor elements to be mounted in a limited space.

Figure 10:
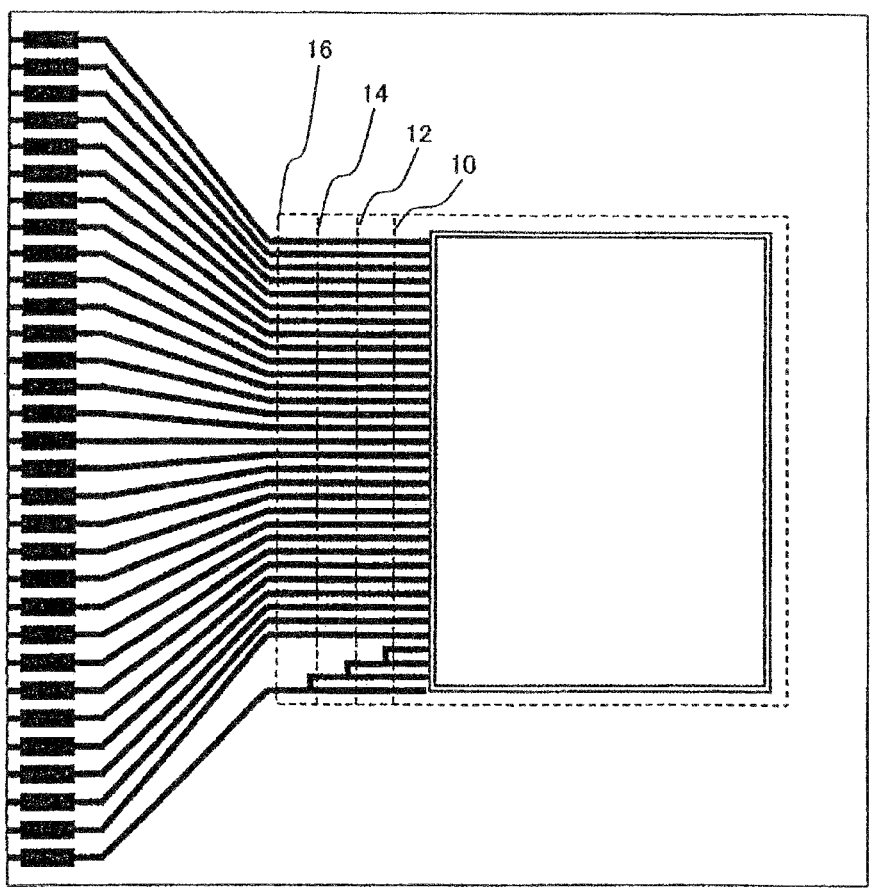
FIG. 10 is a plan view of a flexible substrate for mounting a semiconductor element used in a method for manufacturing the semiconductor device according to the third exemplary embodiment of the present invention.

A method for manufacturing the semiconductor device according to the third exemplary embodiment will be described with reference to FIG. 10. The present exemplary embodiment requires four types of semiconductor packages 9. Thus, as illustrated in FIG. 10, at least one of wires 3 on flexible substrate 2 includes a step-like wiring pattern (illustrated in the lower part of FIG. 10) corresponding to a cutting position that corresponds to a stage in which flexible substrate 2 is mounted. Moreover, a linear wiring pattern with a terminal portion located closer to semiconductor element 1 is placed at each of three positions closer to semiconductor element 1 than the step-like wiring pattern. Semiconductor element 1 is mounted on flexible substrate 2 for inspections. Subsequently, only flexible substrates 2 with normally operating semiconductor elements 1 mounted thereon are cut at respective cutting positions according to the stages in which respective flexible substrates 2 are stacked. Thus, first semiconductor packages 9 corresponding to respective stages can be manufactured. In FIG. 10, a first package cutting position is illustrated at 10, and a second package cutting position is illustrated at 12. A third package cutting position is illustrated at 14, and a fourth package cutting position is illustrated at 16.

Moreover, first semiconductor packages 9 are stacked and joined to substrate 4. Then, second semiconductor package 10 with four semiconductor elements 1 can be manufactured. Like the method for manufacturing the semiconductor device according to the first and second exemplary embodiments, the present manufacturing method allows semiconductor elements 1 to be handled regardless of whether semiconductor elements 1 are for the upper or lower stage until semiconductor elements 1 are inspected. Thus, normally operating semiconductor elements 1 can be efficiently used, enabling an inexpensive semiconductor device to be manufactured.

The first and second exemplary embodiments illustrate second semiconductor package 10 with two first semiconductor packages 9 mounted therein and the method for manufacturing the semiconductor packages. The third exemplary embodiment illustrates second semiconductor package 10 with four first semiconductor packages 9 mounted therein and the method for manufacturing the semiconductor packages. However, in the semiconductor device according to the present exemplary embodiment, the number of first semiconductor packages 9 that can be mounted in second semiconductor package 10 is not limited to two or four. The number can be freely selected according to the application or the like.

Fourth Exemplary Embodiment

Figure 11:
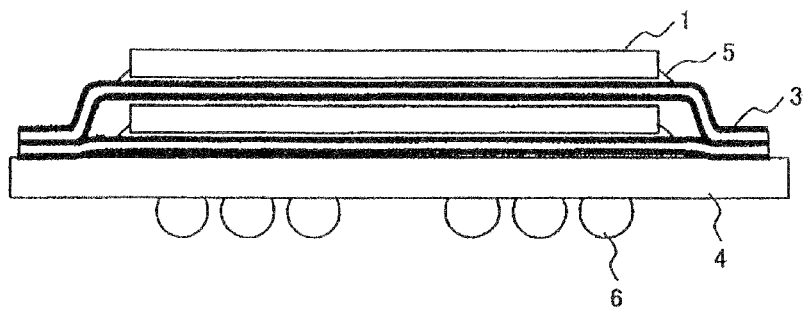
FIG. 11 is a side sectional view of a semiconductor device according to a fourth exemplary embodiment of the present invention.

FIG. 11 is a side sectional view of a semiconductor device according to a fourth exemplary embodiment of the present invention. The present exemplary embodiment is different from the third exemplary embodiment in that wires 3 are drawn out from first semiconductor package 9 in two directions. The present exemplary embodiment is further different from the third exemplary embodiment in that wires 3 are joined to substrate 4 in each of the two directions so as to form second semiconductor package 10. In the present exemplary embodiment, two positions for forming a junction with first semiconductor package 9 need to be provided on substrate 4. Thus, the external size of substrate 4 needs to be correspondingly increased. However, compared to the first exemplary embodiment, the present exemplary embodiment advantageously allows a double number of wires to be drawn out provided that the pitch interval of wires 3 remains unchanged.

Furthermore, the present exemplary embodiment allows the pitch interval of wires 3 to be doubled provided that the number of wires drawn out remains unchanged. Accordingly, the present exemplary embodiment advantageously enhances tolerance for possible misalignment while a junction is being formed.

Figure 12:
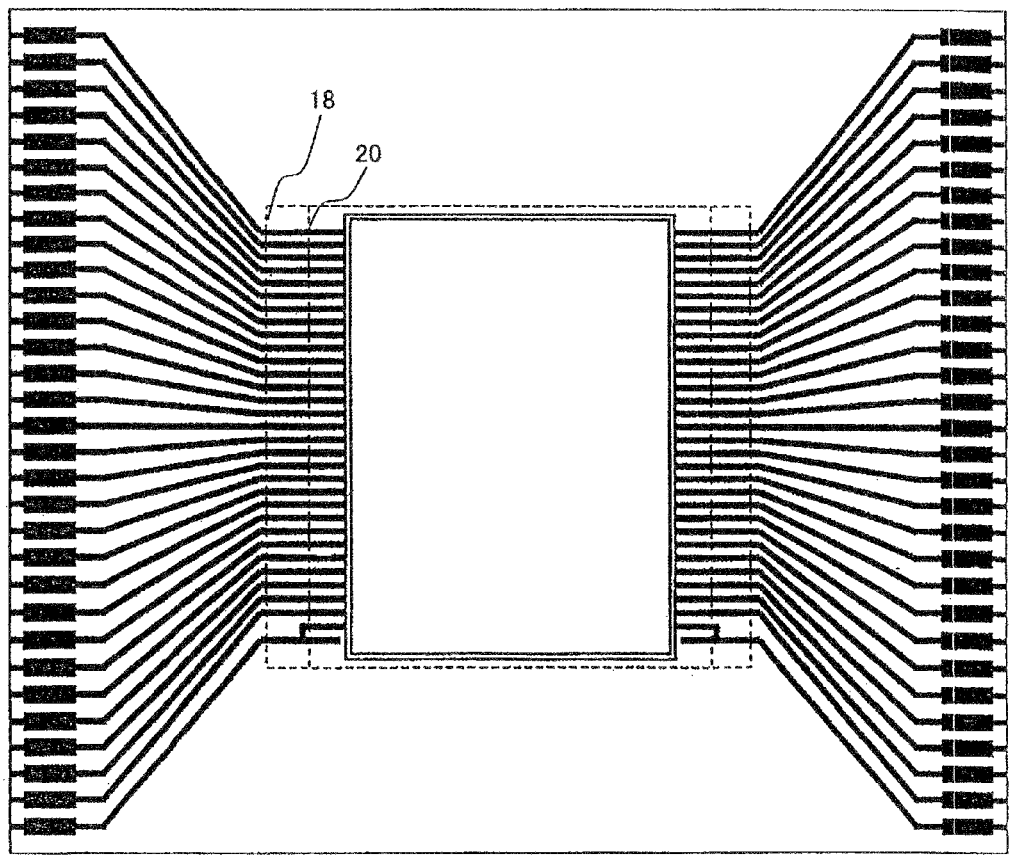
FIG. 12 is a plan view of a flexible substrate for mounting a semiconductor element used in a method for manufacturing the semiconductor device according the fourth exemplary embodiment of the present invention.

A method for manufacturing the semiconductor device according to the fourth exemplary embodiment will be described with reference to FIG. 12. In the present exemplary embodiment, wires 3 are drawn out from first semiconductor package 9 in two directions. Thus, as illustrated in FIG. 12, wiring patterns on flexible substrate 2 are drawn out in the two directions from the position where the semiconductor packages are mounted. The cutting position of flexible substrate 2 differs between the upper and lower stage packages in each of the directions in which wires 3 are drawn out. That is, the cutting position of the upper stage package is as illustrated at 18 in FIG. 12. The cutting position of the lower stage package is as illustrated at 20 in FIG. 12. Although not illustrated in the drawings, since wires 3 are drawn out in the two directions, substrate 4 and flexible substrate 2 are joined together in each of the two directions. The remaining part of the manufacturing method according to the present exemplary embodiment is similar to that according to the first exemplary embodiment.

In the present exemplary embodiment, wires 3 are drawn out from first semiconductor package 9 in the two directions. However, the present invention is not limited to this aspect. Of course, wires 3 may be drawn out in three or four directions. The number of the directions can be selected according to the number of wires required or the like.

Fifth Exemplary Embodiment

Figure 13:
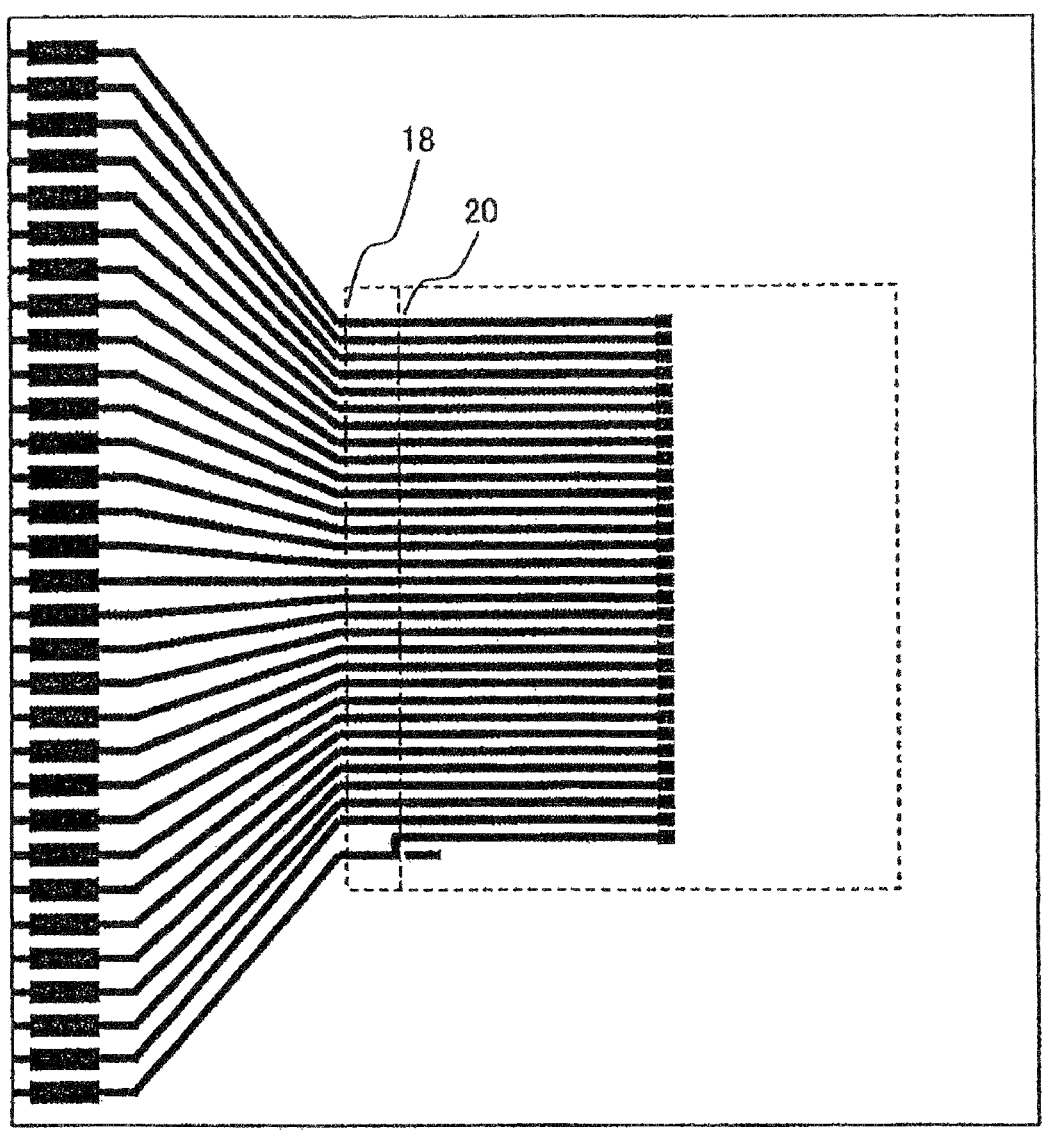
FIG. 13 is a plan view of a flexible substrate for mounting a semiconductor element used in a method for manufacturing a semiconductor device according to a fifth exemplary embodiment of the present invention.

A fifth exemplary embodiment of the present invention will be described with reference to FIG. 13. FIG. 13 is a diagram corresponding to flexible substrate 2 with semiconductor element 1 not yet mounted thereon, that is, the condition illustrated in FIGS. 3A and 3B according to the first exemplary embodiment. The present exemplary embodiment is different from the first exemplary embodiment in that some of wires 3 include a step-like wiring pattern formed therein, the number of the steps being greater than that of the stacked first semiconductor packages. The present exemplary embodiment is further different from the first exemplary embodiment in that a segment-like wiring pattern is provided at a position closer to the mounting position of semiconductor element 1 than the step-like wiring pattern; the segment-like wiring pattern includes a terminal portion on each of the opposite sides thereof and is not electrically connected to semiconductor element 1. In the first exemplary embodiment, wire 3 on upper stage package 7 includes the portion diverging in the two directions. This portion may reduce the speed at which electric signals are communicated. However, in the present exemplary embodiment, wires 3 include no diverging portion, thereby enabling communication at a higher speed. However, during the manufacture of flexible substrate 2, passing current externally through the segment-like wiring pattern is difficult. This may limit plate processing for wires 3. Even with flexible substrates having the same wiring pattern as that in FIG. 1, such a structure as illustrated in FIG. 13 may be obtained simply by changing the cutting position.

Sixth Exemplary Embodiment

Figure 14:
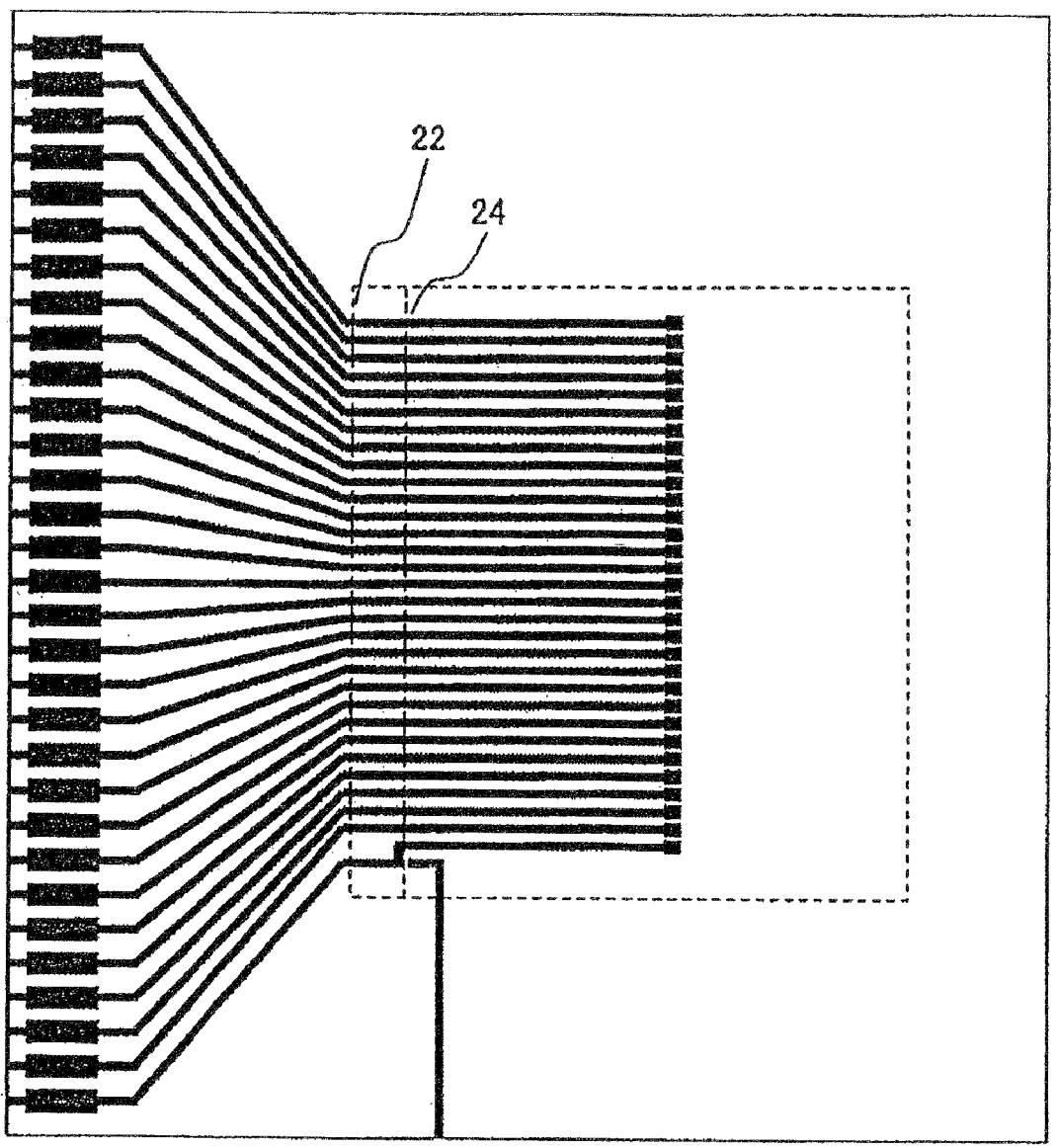
FIG. 14 is a plan view of a flexible substrate for mounting a semiconductor element used in a method for manufacturing a semiconductor device according to a sixth exemplary embodiment of the present invention.

A sixth exemplary embodiment of the present invention will be described with reference to FIG. 14. In the present exemplary embodiment, as is the case with the fifth exemplary embodiment, wires 3 have no diverging portion, thus enabling communication at a higher speed. The segment-like wiring pattern in the fifth exemplary embodiment is drawn out, at a position where other wires 3 are prevented from being obstructed, to the exterior of flexible substrate 2, thereby enabling a reduction in the limit on the plate processing for wires 3. In FIG. 14, the cutting position of the upper stage package is illustrated at 22. The cutting position of the lower stage package is illustrated at 24.

This application is based upon and claims the benefit of priority from Japanese Patent Application No. 2007-261081, filed on Oct. 4, 2007, the disclosure of which is expressly incorporated herein in its entirety by reference.

Although the invention has been described above in connection with several preferred embodiments thereof, it will be appreciated by those skilled in the art that those embodiments are provided solely for illustrating the invention, and should not be relied upon to construe the appended claims in a limiting sense.

What is claimed is:

1. A semiconductor device comprising:
   a second semiconductor package comprising:
   (a) a substrate including a terminal group formed on a surface thereof; and
   (b) at least one first semiconductor package stacked on the substrate and comprising:
      a plurality of flexible substrates, each of which includes a wiring group on a surface thereof and each of which is bending-deformable; and
      a plurality of semiconductor elements mounted on the plurality of flexible substrates,
   wherein electric conduction through the second semiconductor package is established by connecting the wiring group on each of the plurality of flexible substrates to the terminal group on the substrate, and
   wherein at least one terminal of the terminal group on the substrate is electrically connected to all of the plurality of semiconductor elements on said at least one first semiconductor package, and at least one other terminal of the terminal group is electrically connected only to particular semiconductor elements of the plurality of semiconductor elements.

2. The semiconductor device according to claim 1, wherein for the plurality of flexible substrates, the size of each of the plurality of flexible substrates increases consistently with a height at which the flexible substrate is located, and a joining portion of the wiring group on each of the plurality of flexible substrates is located on the terminal group.

3. The semiconductor device according to claim 1, wherein the terminal group is arranged in a line along end surfaces of the plurality of flexible substrates of said at least one first semiconductor package stacked on the substrate.

4. The semiconductor device according to claim 1, wherein said at least one other terminal of the terminal group that is electrically connected only to the particular semiconductor elements of the plurality of semiconductor elements is adjacent to a terminal electrically connected to another particular semiconductor elements of the plurality of semiconductor elements.

5. The semiconductor device according to claim 1, wherein the wiring length of the wiring group on each of the plurality of flexible substrates of said at least one first semiconductor package stacked away from the substrate is larger than that of the wiring group on each of the plurality of flexible substrates of said at least one first semiconductor package stacked closer to the substrate.

6. The semiconductor device according to claim 1, wherein at least one wiring pattern of the wiring group on each of the plurality of flexible substrates is such that a position of an end portion of the wiring group with respect to the row of the terminal group on the substrate varies depending on a distance from the joining portion to the terminal group on the substrate.

7. The semiconductor device according to claim 6, wherein the second package includes a wiring pattern in which the position of the end portion of the wiring group varies in step form, and includes a wiring pattern with a terminal portion located closer to the plurality of semiconductor elements than the step-like wiring pattern.

8. The semiconductor device according to claim 1, wherein a position of at least one wire of the wiring group on each of the plurality of flexible substrates varies in step form, and a distance from the joining portion between the substrate and the terminal group is equal to or larger than the length of the plurality of flexible substrates which varies depending on a stage in which said at least one first semiconductor package is stacked.

9. The semiconductor device according to claim 1, wherein a distance, over which the position of the wire located at said at least one position in the wiring group on each of the plurality of flexible substrates varies in a horizontal direction with respect to the row of the terminal group on the substrate, is the same as a distance between terminals of the terminal group on the substrate.

10. The semiconductor device according to claim 1, wherein the wiring length of the plurality of flexible substrates positioned in an upper part of said at least one first semiconductor package is larger than that of the plurality of flexible substrates positioned in a lower part of said at least one first semiconductor package.

11. A semiconductor device comprising:
    a second semiconductor package comprising:
    (a) a substrate including a terminal group formed on a surface thereof; and
    (b) at least one first semiconductor package stacked on the substrate and comprising:
       a plurality of flexible substrates, each of which includes a wiring group on a surface thereof and each of which is bending-deformable; and
       a plurality of semiconductor elements mounted on the plurality of flexible substrates,
    wherein electric conduction through the second semiconductor package is established by connecting the wiring group on each of the plurality of flexible substrates to the terminal group on the substrate,
    wherein at least one terminal of the terminal group on the substrate is electrically connected to all of the plurality of semiconductor elements on said at least one first semiconductor package, and at least one other terminal of the terminal group is electrically connected only to particular semiconductor elements of the plurality of semiconductor elements, and
    wherein for the plurality of flexible substrates, the size of each of the plurality of flexible substrates increases consistently with a height at which the flexible substrate is located, and a joining portion of the wiring group on each of the plurality of flexible substrates is located on the terminal group.

12. A method for manufacturing a semiconductor device, comprising:
    preparing a plurality of flexible substrates on which semiconductor elements are mounted, each of which includes a flexible substrate on which a semiconductor element is mounted, the flexible substrate including, on a surface thereof, an inspection terminal group and a wiring group continuous with the inspection terminal group, the flexible substrate being bending deformable;

stacking the flexible substrates on a substrate with the terminal group, the semiconductor elements being mounted on the flexible substrates;

using the inspection terminal group to inspect the semiconductor element for operation;

manufacturing at least one first semiconductor package by cutting the flexible substrates on which the semiconductor elements are mounted so that the flexible substrates that are positioned higher is longer in a length direction of the wiring group than the flexible substrates that are positioned lower; and manufacturing a second semiconductor package by joining and overlapping the wiring groups on the terminal group on the substrate, the wiring groups being disposed on the flexible substrates on which the semiconductor elements are mounted.

13. The method for manufacturing a semiconductor device according to claim 12, wherein the wiring group includes a wiring pattern electrically connected to the semiconductor element, the inspection terminal group, and a plurality of wiring patterns not connected to the semiconductor element, and the shapes of the wiring patterns of substantially all the flexible substrates on which the semiconductor elements are mounted are the same.

14. The method for manufacturing a semiconductor device according to claim 12, wherein the wiring pattern not connected to the semiconductor element is connected to an end portion of a laterally extending portion of the wire connected to the semiconductor element.

15. The method for manufacturing a semiconductor device according to claim 12, wherein a joining tool is used to bend at least two of the flexible substrates so as to bring the flexible substrates into tight contact with each other, and to bring each of the flexible substrates into tight contact with the substrate, thus joining the plurality of flexible substrates to the substrate at one time.

16. The method for manufacturing a semiconductor device according to claim 12, wherein first, at least two of the flexible substrates are joined together, and then the plurality of joined flexible substrates are joined to the substrate.

17. A method for manufacturing a semiconductor device, comprising:

mounting a semiconductor element on a flexible substrate, which includes, on a surface thereof, an inspection terminal group and a wiring group connected to the inspection terminal group, the flexible substrate being bending-deformable and including (a) a step-like wiring pattern in which the number of steps is equal to or greater than the number of stacked first semiconductor packages, each of the first semiconductor packages including the semiconductor element mounted on the flexible substrate, and (b) a wiring pattern with an end portion not electrically connected to the semiconductor element and located closer to a position where the semiconductor element is mounted than the step-like wiring pattern;

using the inspection terminal group to inspect the semiconductor element for operation;

cutting the flexible substrates to different lengths according to a stage in which each of the flexible substrates is stacked to manufacture the first semiconductor package corresponding to each stage; and stacking the first semiconductor package on the substrate to manufacture a second semiconductor package.

18. The method for manufacturing a semiconductor device according to claim 17, wherein a joining tool is used to bend at least two of the flexible substrates so as to bring the flexible substrates into tight contact with each other, and to bring each of the flexible substrates into tight contact with the substrate, thus joining the plurality of flexible substrates to the substrate at one time.

19. The method for manufacturing a semiconductor device according to claim 17, wherein first, at least two of the flexible substrates are joined together, and then the plurality of joined flexible substrates are joined to the substrate.

20. A flexible substrate comprising:

a wiring pattern with a linear portion formed on a surface of the flexible substrate, the linear portion being arranged in an area on which a semiconductor element is to be mounted and being connected to the semiconductor element;

an inspection terminal of the semiconductor element formed on the surface of the flexible substrate and connected to the wiring pattern; and a wiring portion formed on the surface of the flexible substrate and having one end that is connected to the linear portion and an other end that is not connected to the semiconductor element, the other end being arranged between the area on which the semiconductor element is to be mounted and the inspection terminal.

21. The flexible substrate according to claim 20, further comprising at least one more wiring portion formed on the surface of the flexible substrate.

22. The flexible substrate according to claim 20, wherein the inspection terminal is formed on each of opposite sides of the flexible substrate.

* * * * *